United States Patent [19]
Jones

[11] Patent Number: 4,699,414
[45] Date of Patent: Oct. 13, 1987

[54] MULTI USE GRIPPER FOR INDUSTRIAL ROBOT

[75] Inventor: Steven P. Jones, Baltimore, Md.

[73] Assignee: The United States of America as represented by the Secretary of the Air Force, Washington, D.C.

[21] Appl. No.: 854,234

[22] Filed: Apr. 21, 1986

[51] Int. Cl.⁴ .............................................. B25J 15/04
[52] U.S. Cl. ................................. 294/119.1; 294/902; 294/907; 901/38; 901/39
[58] Field of Search ...................... 294/86.4, 87.1, 88, 294/103.1, 106, 119.1, 902, 907; 29/739–741; 269/268–270, 272, 902; 901/31–33, 36–39

[56] References Cited

U.S. PATENT DOCUMENTS

| 854,145 | 5/1907 | Broadbooks | 269/272 |
|---|---|---|---|
| 2,861,701 | 11/1958 | Bergsland et al. | |
| 3,261,479 | 7/1966 | Baker et al. | 294/119.1 X |
| 3,636,624 | 1/1972 | Bates | 29/741 X |
| 4,286,380 | 9/1981 | Blout | 294/87.1 X |
| 4,336,926 | 6/1982 | Inagaki et al. | 269/34 |
| 4,345,866 | 8/1982 | Greene | 414/224 |
| 4,479,673 | 10/1984 | Inaba et al. | 294/88 |
| 4,579,380 | 4/1986 | Zaremsky et al. | 294/119.1 |

FOREIGN PATENT DOCUMENTS

| 3325921 | 1/1985 | Fed. Rep. of Germany | 294/119.1 |
|---|---|---|---|
| 18165 | 2/1978 | Japan | 294/119.1 |
| 138271 | 10/1979 | Japan | 294/119.1 |

OTHER PUBLICATIONS

NASA Tech. Briefs (Summer, 1980), vol. 5, No. 2, p. 215, "Mechanical Hand for Gripping Objects" by Clark et al.

Primary Examiner—Johnny D. Cherry
Attorney, Agent, or Firm—Jules J. Morris; Donald J. Singer

[57] ABSTRACT

A robot gripping device 10 for holding and gripping a variety of electronic components. The robot gripping device comprises a guide frame 12, a drive motor 34 and gripping blocks 24, 26 having fingers 42, 44. Finger 42 has prongs 66, 68 and 70 on fingertip 60. Finger 44 has prongs 76 and 78 on fingertip 62. The fingertips 60, 62 accommodate axial resistor-type components at v-grooves 80 and radial capacitor-type components are accommodated by fingertip portions 82, 84, 85 and 86. Cylindrical can shaped components are accommodated by a slight beveling at fingertip portions 82, 84, 85 and 86 as well as a set back of portion 83 on prong 68. The fingers are capable of controlled movements to various centered positions by means of motor 34. When the fingers are brought together they interlock.

11 Claims, 8 Drawing Figures

MULTI USE GRIPPER FOR INDUSTRIAL ROBOT

STATEMENT OF GOVERNMENT INTEREST

The invention described herein may be manufactured and used by or for the Government for governmental purposes without the payment of any royalty thereon.

TECHNICAL FIELD

This invention relates to grippers for industrial robots and more particularly the present invention relates to a compact gripper suitable for use in handling a variety of electronic components.

BACKGROUND OF THE INVENTION

Industrial robots are equipped with a hand commonly called a gripper for holding and manipulating articles during manufacturing processes. Generally, gripping fingers are provided which are optimized for the handling of a particular type of component or workpiece. Conventional grippers are able to move their fingers to a few predetermined positions suitable for a particular object.

Most grippers only have preset open and closed positions. In the open position they provide a space large enough for the fingers of the gripper to be positioned at each side of the object to the manipulated. In the closed position the gripper holds the object firmly without crushing it. The shape of the particular fingers helps hold and control an object when the gripper is in the closed position.

An example of a conventional robot gripper is disclosed in U.S. Pat. No. 4,336,926 to Inagaki et al. The Inagaki et al patent discloses a pneumatically operated manipulator having two fingers 10, 11 which are driven by a chain drive in equal amounts in opposite directions. The fingers are therefore made to come together at an exact gripping center of the device.

The Inagaki et al device appears to be an improvement in the art of effective robot manipulators. This device, however, as with most other conventional robot grippers does not address problems arising from the increased usage of flexible manufacturing systems.

Flexible manufacturing systems are designed for use with a number of different products, components and work pieces. This flexibility increases the value of automation by spreading the great expense of procuring automation equipment (robots) over a multitude of products. Enabling robots to be utilized for manufacturing a variety of goods results in a sharp reduction in overhead cost as compared to older conventional equipment which was specifically optimized for a single component or product and incapable of working with a variety of components that a company produces.

The need for a robot gripper suitable for use with a variety of components has been particularly felt in the electronics industry. One use of electronic grippers is for retrieving electrical components from a standardized form tray in which they are stored. Different inserts in different parts of the tray are generally used to accommodate a mix of components including the typical axial, radial and can type components. Typically, a multitude of these components are knit onto an integrated circuit board in order to complete a circuit board assembly. Use of different robot grippers to grip each different type of component results in high assembly line start up costs. This is particularly true since the components and circuit board are quite small and require miniature robot grippers and manipulators.

In view of the above, a need exists for a robot gripper suitable for use with a variety of different components.

A further need exists for a compact robot gripper suitable for use with a variety of small electronic components.

SUMMARY OF THE INVENTION

The invention comprises a robotic gripping device for gripping and holding a variety of electronic components. The robotic gripping device comprises four basic components: a guide frame, a motor attached to the guide frame and first and second gripper blocks. The gripper blocks are movably attached to the guide frame and are connected to the motor by a rotatable shaft. The motor is used to drive the gripper blocks towards and away from each other.

The gripper blocks each have manipulator fingers extending away from the frame. In a preferred embodiment of the invention there are at least three fingers on the top gripper blocks and each finger has a beveled fingertip portion, a flat portion and a v-grooved portion. The preferred mode of the invention provides for two fingers on one of the gripper blocks and three fingers on the other gripper block, the fingers arranged so that they interlock when brought together. On the gripper block having three fingers, two fingers are beveled and the center finger is set back to accommodate cylindrical can shape components. The two fingers of the two finger gripper are also beveled to accommodate cylindrical can shaped objects. The v-groove accommodates axial, rod shaped components such as resistors. Square components are accommodated by the two fingers of the two finger gripper and by the outer fingers of the three finger gripper and do not touch the center finger.

In the preferred embodiment of the invention, pressure sensors are provided for limiting movement of the gripper blocks within the guide frame. The guide frame is preferably less than 10 inches long and less than 7 inches wide.

BRIEF DESCRIPTION OF THE DRAWINGS

The foregoing and other objects and advantages of the invention will be apparent from the following more particular description of the preferred embodiments of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE INVENTION

Figure 1:
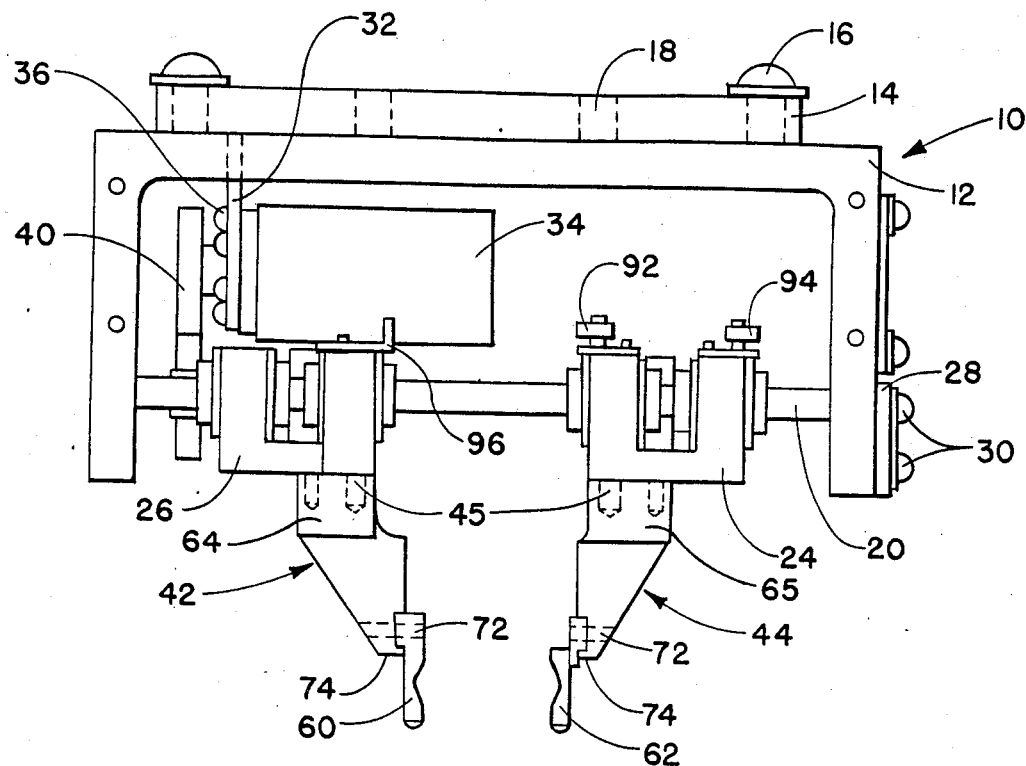
FIG. 1 shows a side view of a robotic gripper device.

FIG. 1 shows a side view of a robot gripper ready for assembly to a robot arm or other automated fixture. The robot gripper assembly 10 has a main guide frame 12 upon which is positioned an attachment plate 14. The attachment plate 14 is bolted to the guide frame 12 with bolts 16. Holes 18 are provided in the attachment plate 14 to facilitate attachment of the robot gripper assembly 10 to the robot arm or fixture.

Figure 2:
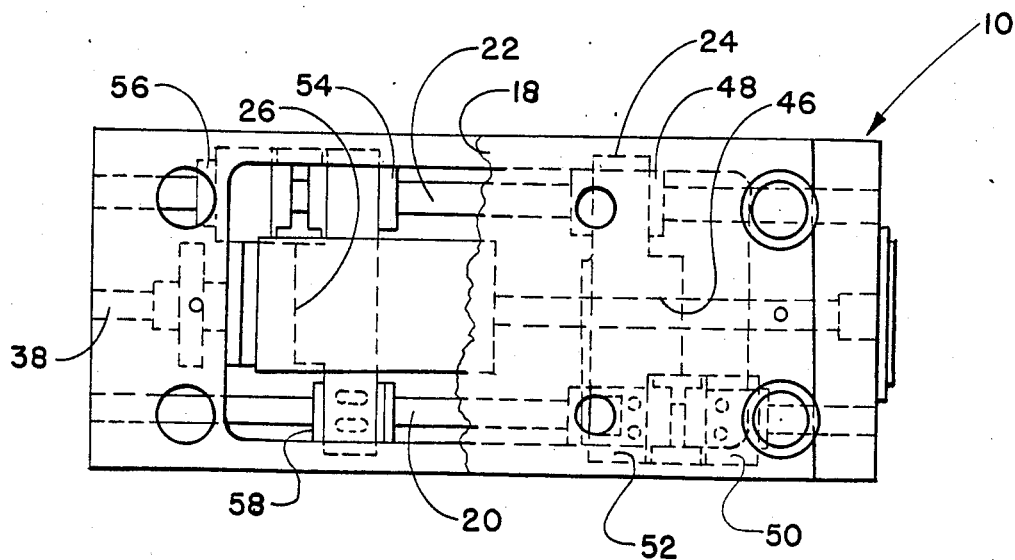
FIG. 2 is a top view of the robotic gripper device of FIG. 1.

In the view of FIG. 2 the attachment plate 18 has been partially broken away in order to afford a clearer top view of the gripper assembly 10. Mounted into the gripper frame 12 are two guide rods 20, 22 upon which ride gripper blocks 24, 26. The guide rods are slid through the frame and secured by plate 28 and bolts 30.

A motor mounting plate 32 is fixedly attached to frame 12 and provides a mounting surface for direct current electric motor 34. The motor is secured to the mounting plate with bolts or other fastening means 36.

The motor is used to rotate a left and right hand threaded lead screw 38 (FIG. 2) that moves gripper blocks 24 and 26 along guide rods 20, 22. The lead screw 38 is driven from the motor by a drive train 40 which can comprise either gears or a chain drive. The lead screw 38 drives the gripper blocks 24, 26 by engaging with a threaded hole 46 or alternately a nut positioned in the gripper blocks.

The gripper blocks in turn control the movement of gripping fingers 42 and 44. The gripping fingers are specially shaped, as will be discussed below, to hold a variety of electronic components. The motor varies the center distance between the fingers in order to accommodate the different components.

The gripper blocks 24, 26 are provided with three point bearings to aid their smooth movement along guide rods 20, 22. Gripper block 24 is provided with bearings 48, 50 and 52 while gripper block 26 is provided with bearings 54, 56 and 58. These bearings can be either sleeve, roller or ball type bearings. This three point suspension provides for smooth and controlled movement of the gripper blocks when driven by the drive screw 38.

The motor is mounted inside the gripper frame 12 in order to minimize the size of the gripper assembly. The direct current (dc) motor is controlled by a closed loop dc circuit controller which controls the position of the blocks and the force applied upon a captured component.

Guide block travel is controlled in two ways. Primary control of the guide blocks is accomplished through sensors 92 and 94 which are touch sensors that prevent overtravel of the guide blocks. For example, as the guide blocks move further apart, both guide blocks approach the edge of the frame 12. Sensor 94 is positioned to contact frame 12 before the motor drivetrain 40 comes into contact with frame 12 and is damaged. A positive signal caused by frame contact at sensor 94 arrests movement of the guide block. Alternatively, as the guide blocks move closer together touch sensor 92 will make contact with flange 96 which is positioned on guide block 26. A contact signal from sensor 92 is used to prevent the guide blocks from crashing into each other and possibly damaging the fingers 60, 62.

Another means of controlling the motion of the guide blocks is by sensing motor current. As the guide blocks and fingers move together to trap an electronic component, contact with that component results in a resistance to movement which in turn increases the current load on the motor. This motor current increase is automatically sensed through an amperage monitoring circuit so that the indication of current rise is used to arrest the motor. If sensor 92 activates instead, this is an indication that the component was dropped or missed by fingers 60, 62. Sensor 92 thereupon signals for the motor to stop and is therefore used as a fail safe device. These types of sensors are very important in this type of variable center gripper which, unlike most conventional grippers, does not have preset open and closed positions but rather is adjustable for a variety of component parts and shapes.

After a component is firmly held by the finger assemblies 42, 44 it is brought by robot arm to an assembly area where the gripping fingers 60, 62 hold the component as the leads are die formed for a particular circuit board application.

Figure 3:
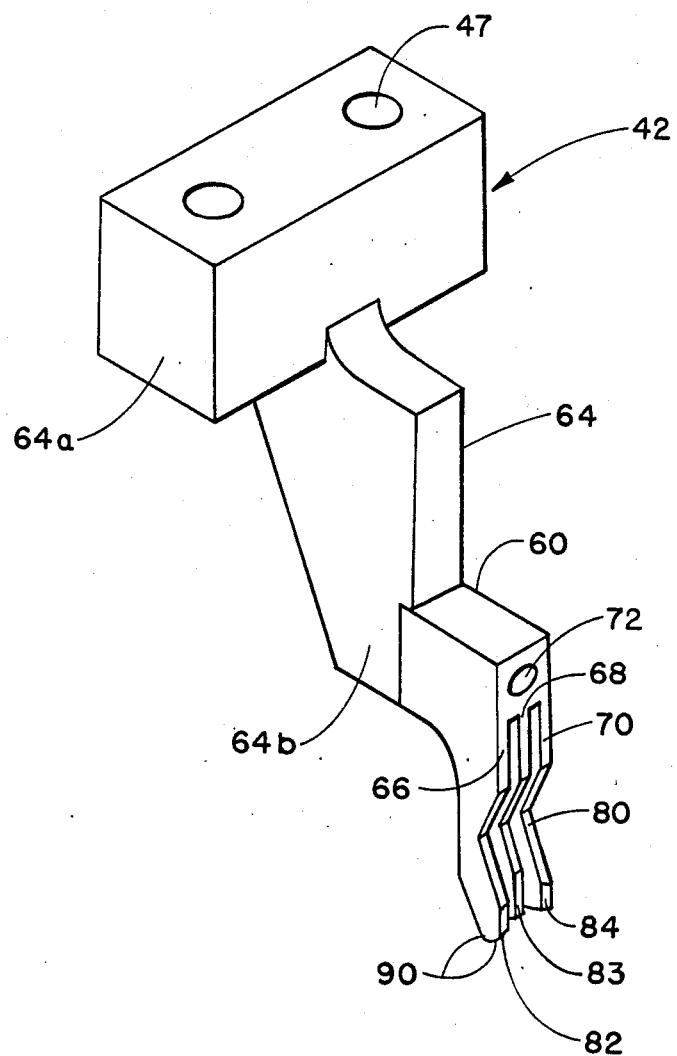
FIG. 3 is a perspective view of a gripper block and finger tip assembly.
Figure 4:
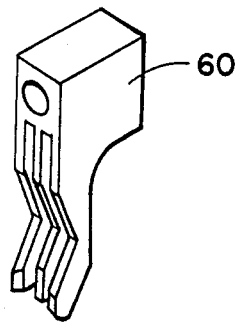
FIG. 4 is a perspective view of the fingertip of FIG. 3.

The finger assemblies can be understood more readily with reference to FIG. 3 which is a close up perspective view of finger assembly 42. The finger assemblies 42, 44 are both fitted to the gripper blocks by bolts 45 (FIG. 1). Finger assemblies 42, 44 comprise mounting blocks 64, 65 and fingers 60, 62. Both fingers 60 and 62 are shown in detail in the views of FIGS. 4–6.

The finger mounting block 64 (FIG. 3) is machined from a single piece of aluminum and includes both a mounting section 64a having mounting holes 47 and a finger mounting section 64b adjoining finger 60. The finger 60 should be made of a stronger material than the mounting, preferably stainless steel. This is to insure that the relatively thin finger prongs 66, 68 and 70 will not be subject to deformation or breakage. The finger 60 is assembled to the finger mounting through the use of a force fitted pin (not shown) inserted in hole 72. The pin is driven into the mounting 64b. In order to prevent swing of the finger from side to side a set screw is used in hole 74 (FIG. 1) to lock the finger in place.

Since the finger mounting 42 is attached to the gripper block 26 by only two bolts 45, it is easy to replace a finger when required. Finger replacement is required if the fingertips and prongs are somehow damaged or when a special fingertip is required.

The fingertips 60, 62 have been devised to insure that the gripper is able to pick up all three basic types of electronic components and hold them firmly for electrical testing and forming.

Figure 5:
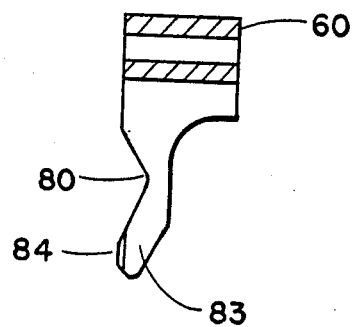
FIG. 5 is a side view of the fingertip of FIG. 3.
Figure 6:
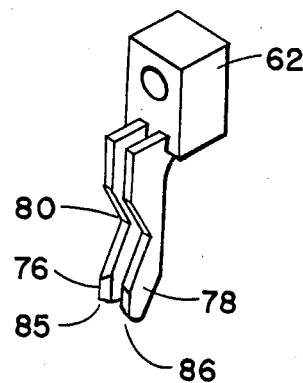
FIG. 6 is a perspective view of a fingertip which opposes and interlocks with the fingertip of FIG. 3.

Finger 60, as mentioned above, has three prongs. All three prongs 66, 68, 70 have a v-grooved section 80 and lower fingertip section 82, 83 and 84. The V-grooved sections are identical, however, the fingertip sections differ somewhat from each other. Fingertips 82 and 84 on the outer prongs are slightly opposingly beveled to accept a cylindrically shaped component while fingertip 83 on the center prong is set back (FIG. 5).

The three prongs of finger 60 are positioned to interlock with and receive finger 62 which has two prongs 76 and 78. The prongs have a v-groove portion 80 and fingertips 85 and 86. Fingertips 85 and 86 are beveled similar to fingertips 82 and 84 in order to accept cylindrically shaped components.

The exact shape and position of the prongs are most important in insuring the firm grasp of different types of components. There are basically three types of electronic components which the gripper must be able to pick up and hold, cans, axials and radials. Cans are typically transistors and transistor-like components which resemble a cylinder with wire leads extending from one end. Axials are generally resistors which comprise thin cylinders with leads at both ends. Finally, radials are most often capacitors or variable resistors and comprise rectangular ceramic pieces with leads extending from the bottom surface.

Fingers 60, 62 have been devised to firmly grasp all of the above types of electronics components. Axials are picked up by essentially a shoveling effect and held in the v-grooved sections 80 of the two fingers. Radial type components, ie., capacitors, are held by the fingertips sections 82, 84, 85, 86 of the two fingers. The radials are not necessarily held by all the fingertips. Fingertip 83 of the central prong 68 of finger 60 is set back and won't generally contact radial components.

Can components are held upright by the fingertips 82, 84, 85 and 86 which are slightly beveled to accept the cylindrical can. Finger tip 83 is not beveled but is set back to accept the curve of the can.

Slight beveled portions 90 (FIG. 3) are also formed on the very bottom of all the fingertips. This slight curvature at the bottom of fingers acts as a guide when the gripper fingers capture components. Preferably, when the fingertips are misaligned with the component during a capture, the component rolls or slides as a result of bevel 90 contact rather than being trapped and damaged.

Figure 7:
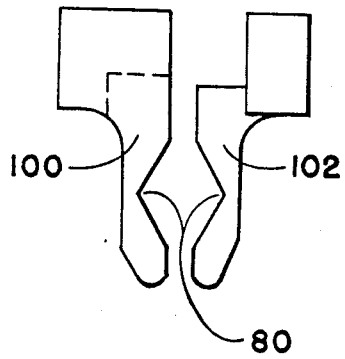
FIG. 7 is a side view of two fingertips of a second embodiment of the invention.
Figure 8:
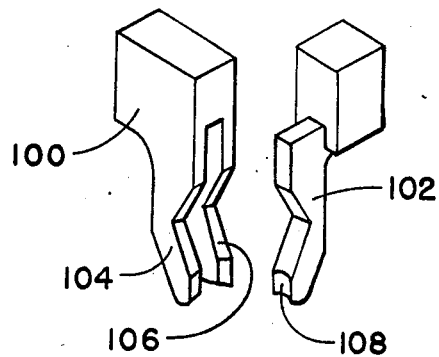
FIG. 8 is a perspective view of two opposing fingertips of FIG. 7.

Another embodiment of the gripping fingers of the invention can be readily understood with reference to FIGS. 7 and 8. FIG. 7 shows a side view of a two prong gripping finger 100 and a single prong finger 102. These fingers are also shown in perspective in FIG. 8. Operation of these gripping fingers is essentially the same as that discussed in reference to gripping fingers 60 and 62. In some instances it may be advantageous to minimize the number of gripping prongs used to grasp the components.

Finger 100 has two prongs and is quite similar to finger 62 discussed above. The v-grooves and the fingertips are essentially the same as on finger 62. Finger 100 however is made to interlock with the single prong finger 102. Finger 102 has a slightly U-shaped flat fingertip area 108 to accept can shaped components in combination with beveled prongs 104 and 106. In all other respects these fingers are essentially the same as those discussed above.

The robot gripper has been developed and used with a variety of electronic components. The gripper is quite small and lightweight and is only 6.50 inches long, 3.75 inches wide and 4.75 inches high. Its total weight is a mere 2.5 pounds, yet the electric motor 34 included within the gripper is sufficiently strong to drive the fingers to firmly grasp and hold a variety of electronic components. The use of fingertips which can firmly hold this great variety of components eliminates the need for switching fingertips each time a different component is to be handled. Further, the automatic gripper has been devised so that gripping fingers can be easily changed if they are damaged or need to be replaced.

While the invention has been particularly described with reference to the preferred embodiments thereof, it will be understood by those skilled in the art that various changes in substance and form can be made therein without having departed from the spirit and the scope of the invention as detailed in the attached claims.

I claim:

1. A robotic device for gripping and holding a variety of electronic components comprising:
    (a) a guide frame;
    (b) a motor having a rotatable shaft, attached to said guide frame;
    (c) a first gripper block movably attached to said guide frame and connected for movement to said rotatable shaft wherein said first gripper block comprises a three prong finger portion, each prong having a fingertip portion and a 'v' groove portion and in which the three prongs comprise a right side prong, a center prong and a left side prong wherein the center prong is set back from the right and left prongs to accommodate cylindrical can shaped components; and
    (d) a second gripper block movably attached to said guide frame and connected for movement to said rotatable shaft wherein the second gripper block comprises a finger portion of at least two finger prongs having fingertip portions and 'v' groove portions, and wherein the two finger prongs are spaced to interlock with said three finger prongs of said first gripper block.

2. The robotic device of claim 1 wherein the guide frame further comprises guide shafts for directing movement of the first and second gripper blocks.

3. The robotic device of claim 1 further comprising pressure sensors for limiting movement of the gripper blocks.

4. The robotic device of claim 1 wherein the robotic device is less than 10 inches long, less than 7 inches wide and less than 7 inches high.

5. The robotic device of claim 1 wherein a left and right hand threaded leadscrew comprises a rotatable connection between said first and second gripper blocks and said rotatable shaft.

6. The robotic device of claim 1 wherein said motor comprises a direct current servo motor.

7. The robotic device of claim 1 wherein the finger prongs of the second gripper block are opposingly beveled to accommodate cylindrical can shaped components.

8. A robotic device for gripping and holding a variety of electronic components comprising:
    (a) a guide frame;
    (b) a motor attached to said guide frame, the motor having a rotatable shaft;
    (c) a first gripper block movably attached to said guide frame and connected for movement to said rotatable shaft wherein said first gripper block comprises a finger portion having a u-shaped finger for grasping can shaped components; and
    (d) a second gripper block movably attached to said guide frame and connected for movement to said rotatable shaft wherein the second gripper block comprises at least two finger portions having opposingly beveled fingertips for grasping can shaped components and wherein the two finger portions are spaced to interlock with said finger portion of said first gripper block.

9. The robotic device of claim 8 wherein the guide frame further comprises guide shafts for directing movement of the first and second gripper blocks.

10. The robotic device of claim 8 further comprising pressure sensors for limiting movement of the gripper blocks.

11. The robotic device of claim 8 wherein said finger portions of both of said gripper blocks further comprise v-groove portions for holding certain components.

* * * * *